(12) United States Patent
Park et al.

(10) Patent No.: US 10,008,648 B2
(45) Date of Patent: Jun. 26, 2018

(54) SEMICONDUCTOR LIGHT EMITTING DEVICE

(71) Applicant: SEMICON LIGHT CO., LTD., Gyeonggi-do (KR)

(72) Inventors: Eun Hyun Park, Gyeonggi-do (KR);
Soo Kun Jeon, Gyeonggi-do (KR);
Kyoung Min Kim, Gyeonggi-do (KR);
Dong So Jung, Gyeonggi-do (KR);
Kyeong Jea Woo, Gyeonggi-do (KR)

(73) Assignee: SEMICON LIGHT CO., LTD., Gyeonggi-do (KR)

( * ) Notice: Subject to any disclaimer, the term of this patent is extended or adjusted under 35 U.S.C. 154(b) by 0 days. days.

(21) Appl. No.: 15/018,425

(22) Filed: Feb. 8, 2016

(65) Prior Publication Data
US 2017/0104141 A1    Apr. 13, 2017

(30) Foreign Application Priority Data

Oct. 8, 2015   (KR) .................. 10-2015-0141700
Oct. 8, 2015   (KR) .................. 10-2015-0141704
Nov. 18, 2015  (KR) .................. 10-2015-0161713
Nov. 18, 2015  (KR) .................. 10-2015-0161719

(Continued)

(51) Int. Cl.
*H01L 29/20*    (2006.01)
*H01L 33/60*    (2010.01)
*H01L 33/56*    (2010.01)
*H01L 33/48*    (2010.01)
*H01L 33/00*    (2010.01)

(Continued)

(52) U.S. Cl.
CPC ............ *H01L 33/60* (2013.01); *H01L 33/486* (2013.01); *H01L 33/56* (2013.01); *H01L 33/0079* (2013.01); *H01L 33/20* (2013.01); *H01L 33/62* (2013.01)

(58) Field of Classification Search
CPC ................................ H01L 33/60; H01L 33/56
See application file for complete search history.

(56) References Cited

U.S. PATENT DOCUMENTS 7,262,436 B2   8/2007   Kondoh et al. .............. 257/94
7,453,093 B2   11/2008  Kim et al. .................. 257/79
(Continued)

FOREIGN PATENT DOCUMENTS

JP   1997-083018   3/1997   ............ H01L 33/00
JP   2009-071186   4/2009   ............ H01L 33/00
(Continued)

*Primary Examiner* — Dale E Page
*Assistant Examiner* — Wasiul Haider
(74) *Attorney, Agent, or Firm* — Harness, Dickey & Pierce, P.L.C.

(57) ABSTRACT

Disclosed is a semiconductor light emitting device, including: a body, which has a bottom part with at least one hole formed therein, a side wall, and a cavity defined by the bottom part and the side wall; a semiconductor light emitting chip, which is placed in each hole and includes plural semiconductor layers adapted to generate light by electron-hole recombination and electrodes electrically connected to the plural semiconductor layers; and an encapsulating member provided at least to the cavity to cover the semiconductor light emitting chip, in which the electrodes of the semiconductor light emitting chip are exposed towards the lower face of the bottom part of the body.

16 Claims, 21 Drawing Sheets

(30) Foreign Application Priority Data

Dec. 16, 2015 (KR) ........................ 10-2015-0180306
Dec. 16, 2015 (KR) ........................ 10-2015-0180314

(51) Int. Cl.
*H01L 33/20* (2010.01)
*H01L 33/62* (2010.01)

(56) References Cited

U.S. PATENT DOCUMENTS

| | | | |
|---|---|---|---|
| 7,473,933 B2 | 1/2009 | Yan ................................ | 257/88 |
| 8,748,202 B2 | 6/2014 | Kwon et al. .................... | 438/34 |
| 8,772,794 B2 | 7/2014 | Lee ................................. | 257/88 |
| 8,957,448 B2 | 2/2015 | Suh et al. ....................... | 257/99 |
| 2003/0067264 A1 | 4/2003 | Takekuma .................... | 313/501 |
| 2005/0167682 A1 | 8/2005 | Fukasawa ...................... | 257/79 |
| 2006/0022215 A1 | 2/2006 | Arndt et al. .................... | 257/99 |
| 2006/0091416 A1* | 5/2006 | Yan .................... | H01L 25/0753 |
| | | | 257/99 |
| 2009/0065793 A1 | 3/2009 | Hon et al. ....................... | 257/98 |
| 2010/0149806 A1 | 6/2010 | Yiu .......................... | 362/249.02 |
| 2011/0127558 A1 | 6/2011 | Park et al. ...................... | 257/98 |
| 2012/0112227 A1* | 5/2012 | Toyama ............... | H01L 33/486 |
| | | | 257/98 |
| 2012/0302124 A1 | 11/2012 | Imazu .............................. | 445/58 |
| 2013/0001599 A1 | 1/2013 | Lee ................................ | 257/88 |
| 2014/0034930 A1* | 2/2014 | Seo .................... | H01L 51/5016 |
| | | | 257/40 |
| 2014/0071700 A1 | 3/2014 | Yoon et al. .................... | 362/382 |
| 2014/0203306 A1* | 7/2014 | Ito ............................ | H01L 33/44 |
| | | | 257/88 |
| 2014/0225517 A1* | 8/2014 | Nam .................. | H05B 33/0821 |
| | | | 315/185 R |
| 2015/0062965 A1 | 3/2015 | Oh et al. ....................... | 352/608 |
| 2015/0311405 A1 | 10/2015 | Oyamada et al. ...... | H01L 33/60 |
| 2016/0087161 A1 | 3/2016 | Wirth et al. .......... | H01L 33/483 |

FOREIGN PATENT DOCUMENTS

| | | | | |
|---|---|---|---|---|
| JP | 5644352 | 12/2014 | ............ | H01L 33/60 |
| JP | 2015-073043 | 4/2015 | ............ | H01L 33/64 |
| KR | 10-0610650 | 8/2006 | ............ | H01L 33/48 |
| KR | 20-2010-0006630 | 6/2010 | ............ | H01L 33/62 |
| KR | 10-2010-0093992 | 8/2010 | ............ | H01L 33/62 |
| KR | 10-2012-0002104 | 1/2012 | ............ | H01L 33/62 |
| KR | 10-2012-0045539 | 5/2012 | ............ | H01L 33/62 |
| KR | 10-2012-0052107 | 5/2012 | ............ | H01L 33/62 |
| KR | 10-1368720 | 2/2014 | ............ | H01L 33/36 |
| KR | 10-2014-0026120 | 3/2014 | ............ | H01L 33/48 |
| KR | 10-2014-0026163 | 3/2014 | ............ | H01L 33/48 |
| KR | 10-2014-0110257 | 9/2014 | ............ | H01L 33/48 |
| KR | 10-1469237 | 11/2014 | ............ | H01L 33/60 |
| KR | 10-2015-0037217 | 4/2015 | ............ | H01L 33/48 |
| KR | 10-2015-0107086 | 9/2015 | ............ | H01L 33/62 |
| KR | 10-2015-0121364 | 10/2015 | ............ | H01L 33/64 |
| WO | WO 2011/122531 | 10/2011 | ............ | H01L 33/58 |
| WO | WO 2016/039593 | 3/2016 | ............ | H01L 33/00 |

* cited by examiner

SEMICONDUCTOR LIGHT EMITTING DEVICE

CROSS-REFERENCE TO RELATED APPLICATIONS

This application claims the benefit and priority of Korean Patent Application 10-2015-0180314 filed Dec. 16, 2015, Korean Patent Application 10-2015-0180306 filed Dec. 16, 2015, Korean Patent Application 10-2015-0161719 filed on Nov. 18, 2015, Korean Patent Application 10-2015-0161713 filed on Nov. 18, 2015, Korean Patent Application 10-2015-0141704 filed on Oct. 8, 2015, and Korean Patent Application 10-2015-0141700 filed on Oct. 8, 2015. The entire disclosures of the above applications are incorporated herein by references.

FIELD

The present disclosure relates generally to a semiconductor light emitting device, and more particularly to a semiconductor light emitting device with improved light extraction efficiency.

BACKGROUND

This section provides background information related to the present disclosure which is not necessarily prior art. Unless specified otherwise, it is appreciated that throughout the description, directional terms, such as upper side/lower side, over/below and so on are defined with respect to the directions in the accompanying drawings.

FIG. 1 is a view showing an exemplary embodiment of a semiconductor light emitting chip in the prior art.

In this semiconductor light emitting chip, there is provided a growth substrate 10 (e.g., a sapphire substrate), and layers including a buffer layer 20, a first semiconductor layer 30 having a first conductivity (e.g., an n-type GaN layer), an active layer 40 adapted to generate light by electron-hole recombination (e.g., INGaN/(In)GaN MQWs) and a second semiconductor layer 50 having a second conductivity different from the first conductivity (e.g., a p-type GaN layer) are deposited over the substrate in the order mentioned. A light-transmitting conductive film 60 for current spreading is then formed on the second semiconductor layer, followed by an electrode 70 serving as a bonding pad formed on the light-transmitting conductive film, and an electrode 80 (e.g., a Cr/Ni/Au stacked metallic pad) serving as a bonding pad is formed on an etch-exposed portion of the first semiconductor layer 30. This particular type of the semiconductor light emitting chip as in FIG. 1 is called a lateral chip. Here, the side of the growth substrate 10 serves as a mounting face during electrical connections to outside.

FIG. 2 is a view showing another exemplary embodiment of a semiconductor light emitting chip disclosed in U.S. Pat. No. 7,262,436. For convenience of description, different reference numerals are used for some parts.

In this semiconductor light emitting chip, there is provided a growth substrate 10, and layers including a first semiconductor layer 30 having a first conductivity, an active layer 40 adapted to generate light by electron-hole recombination and a second semiconductor layer 50 having a second conductivity different from the first conductivity are deposited over the substrate in the order mentioned. Three-layered electrode films 90, 91 and 92 adapted to reflect light towards the growth substrate 10 are then formed on the second semiconductor layer, in which first electrode film 90 can be a reflective Ag film, second electrode film 91 can be a Ni diffusion barrier, and third electrode film 92 can be an Au bonding layer. Further, an electrode 80 serving as a bonding pad is formed on an etch-exposed portion of the first semiconductor layer 30. Here, the side of the electrode film 92 serves as a mounting face during electrical connections to outside. This particular type of the semiconductor light emitting chip as in FIG. 2 is called a flip chip. While the electrode 80 formed on the first semiconductor layer 30 is placed at a lower height level than the electrode films 90, 91 and 92 formed on the second semiconductor layer in the case of the flip chip shown in FIG. 2, it may be formed at the same height level as the electrode films. Here, height levels are given with respect to the growth substrate 10.

FIG. 3 is a view showing one exemplary embodiment of a semiconductor light emitting device 100 in the prior art.

The semiconductor light emitting device 100 is provided with lead frames 110 and 120, a mold 130, and a vertical type light-emitting chip 150 in a cavity 140 which is filled with an encapsulating member 170 containing a wavelength converting material 160. The lower face of the vertical type light-emitting chip 150 is directly electrically connected to the lead frame 110, and the upper face thereof is electrically connected to the lead frame 120. A portion of the light coming out of the vertical type light-emitting chip 150 excites the wavelength converting material 160 such that light of a different color is generated, and these two different lights are mixed to produce white light. For instance, the semiconductor light emitting chip 150 generates blue light, and the wavelength converting material 160 is excited to generate yellow light. Then these blue and yellow lights can be mixed to produce white light. Even though the semiconductor light emitting device shown in FIG. 3 is produced using a vertical type light emitting chip 150, other types of the semiconductor light emitting devices similar to one in FIG. 3 may be produced using the semiconductor light emitting chips illustrated in FIG. 1 and FIG. 2. However, as for the semiconductor light emitting device 100 described in FIG. 3, a bonded state should be established between the semiconductor light emitting chip 150 and the lead frames 110 and 120. Particularly, in case of using the flip chip shown in FIG. 2, it is very likely that light intensity from the flip chip may be lost due to a bonding material (e.g., solder paste) used for bonding the flip chip to the lead frames 110 and 120. Moreover, a properly bonded state may not be established between the semiconductor light emitting chip 150 and the lead frames 110 and 120 because of heat that is generated during the SMT process for bonding the semiconductor light emitting device 100 to an external substrate (e.g., a PCB substrate, a sub-mount, etc.)

In this regard, the present disclosure is directed to provide a semiconductor light emitting device in which electrodes of a semiconductor light emitting chip used in a semiconductor light emitting device are bonded directly to an external substrate. More particularly, the present disclosure is directed to provide a semiconductor light emitting device using a flip chip, in which no bonding between lead frames and the flip chip is required such that no light intensity from the flip chip would be lost due to bonding between the lead frames and the flip chip despite the use of the flip chip.

SUMMARY

The problems to be solved by the present disclosure will be described in the latter part of the best mode for carrying out the invention.

This section provides a general summary of the disclosure and is not a comprehensive disclosure of its full scope or all of its features.

According to one aspect of the present disclosure, there is provided a semiconductor light emitting device, including: a body which has a bottom part with at least one hole formed therein, a side wall, and a cavity defined by the bottom part and the side wall; a semiconductor light emitting chip which is placed in each hole and includes plural semiconductor layers adapted to generate light by electron-hole recombination and electrodes electrically connected to the plural semiconductor layers; and an encapsulating member provided at least to the cavity to cover the semiconductor light emitting chip, wherein the electrodes of the semiconductor light emitting chip are exposed towards the lower face of the bottom part of the body.

The advantageous effects of the present disclosure will be described in the latter part of the best mode for carrying out the invention.

DETAILED DESCRIPTION

Hereinafter, the present disclosure will now be described in detail with reference to the accompanying drawings. The detailed description herein is presented for purposes of illustration only and not of limitation. The scope of the invention is defined by the appended claims. For example, the steps recited in any of the method or process descriptions may be executed in any order and are not necessarily limited to the order presented. Furthermore, any reference to singular includes plural embodiments, and any reference to more than one component or step may include a singular embodiment or step. Also, the steps recited in any of the method or process descriptions may be executed in any order and are not necessarily limited to the order presented.

Figure 4:
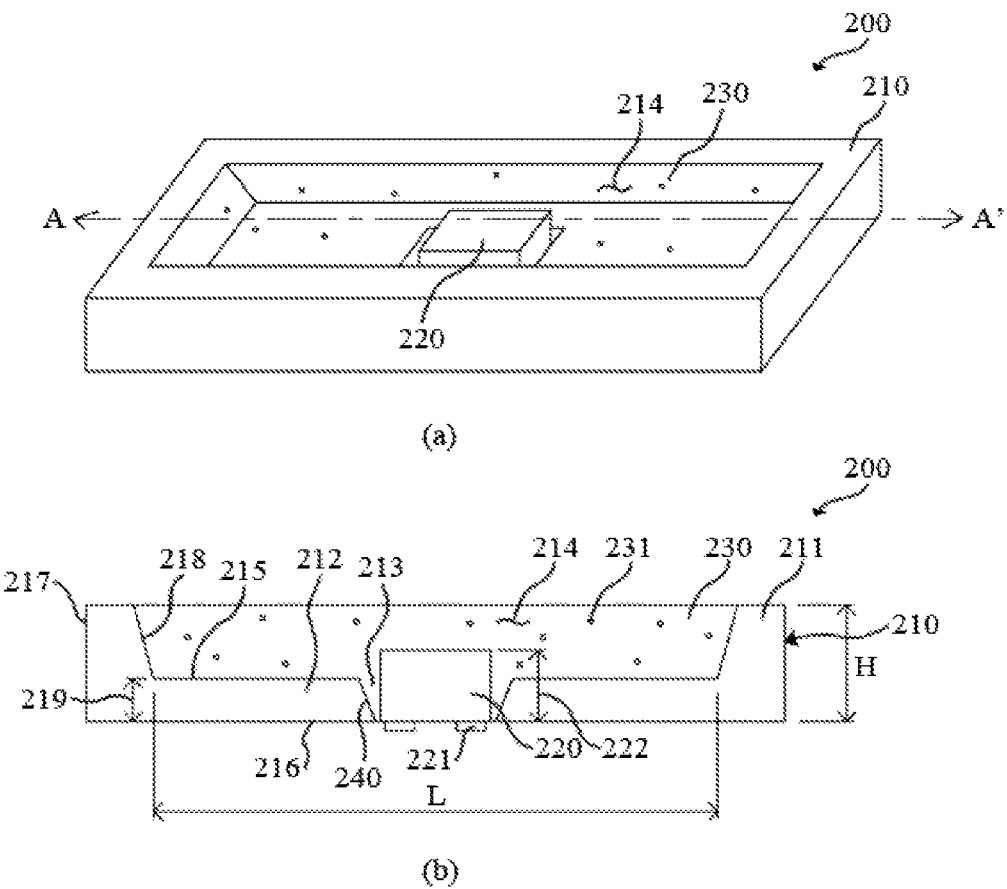
FIG. 4 shows one exemplary embodiment of a semiconductor light emitting device according to the present disclosure.

FIG. 4 shows one exemplary embodiment of a semiconductor light emitting device 200 according to the present disclosure.

FIG. 4a is a perspective view, and FIG. 4b is a sectional view taken along line AA'.

The semiconductor light emitting device 200 includes a body 210, a semiconductor light emitting chip 220 and an encapsulating member 230.

The body 210 has a side wall 211 and a bottom part 212. The bottom part 212 has a hole 213 therein. The body 210 also includes a cavity 214 defined by the side wall 211 and the bottom part 212. The bottom part 212 has an upper face 215 and a lower face 216. The side wall 211 has an outer face 217 and an inner face 218. The side wall 211 may have height H smaller than length L of the bottom part 212. For instance, the height H of the side wall 211 may range from 0.1 mm to 0.6 mm, end points inclusive, and the length L of the bottom part 212 may be 0.5 mm or more. If appropriate, the side wall 211 may be omitted (not shown). It is desirable that the hole 213 is as large as the semiconductor light emitting chip 220 or 1.5 times larger than the semiconductor light emitting chip 220. Moreover, it is desirable that the lateral part 240 of the hole 213 is slanted in order to improve the efficiency of light extraction.

The semiconductor light emitting chip 220 is placed in the hole 213. Examples of the semiconductor light emitting chip 220 may include a lateral chip, a vertical chip and a flip chip. The flip chip is preferentially used considering that the electrodes 221 of the semiconductor light emitting chip in the present disclosure are exposed towards the lower face 216 of the bottom part 212 of the body 210. It is desirable that the bottom part 212 has a height 219 less than a height 222 of the semiconductor light emitting chip 220. This is so because when the height 219 of the bottom part 212 is greater than the height 222 of the semiconductor light emitting chip 220, the efficiency of light extraction of the semiconductor light emitting device 200 may fall. Despite a possible decrease in the efficiency of light extraction, the bottom part 212 may be configured to have the height 219 greater than the height of the semiconductor light emitting chip 220, taking other factors such as an optical path into consideration. The height 219 of the bottom part 212 and the height 222 of the semiconductor light emitting chip 220 can be measured with respect to the lower face 216 of the bottom part 212. The height 222 of the semiconductor light emitting chip 220 may range from 0.05 mm to 0.5 mm, end points inclusive. The height 219 of the bottom part 212 may range from 0.08 mm to 0.4 mm, end points inclusive.

The encapsulating member 230 is provided at least to the cavity 214 and serves to cover the semiconductor light emitting chip 220 such that the semiconductor light emitting chip 220 placed in the hole 213 can be fixed to the body 210. The encapsulating member 230 is light transmissive and may be made of either epoxy resins or silicone resins. If necessary, the encapsulating member 230 can have a wavelength converting material 231. Any material (e.g., pigments, dyes or the like) can be used for the wavelength converting material 231, provided that it converts light generated from the active layer of the semiconductor light emitting chip 220 into light having a different wavelength, yet it is desirable to use phosphors (e.g., YAG, (Sr,Ba,Ca)$_2$SiO$_4$:Eu or the like) in terms of the efficiency of light conversion). In addition, the wavelength converting material 231 can be selected depending on the color of light from a semiconductor light emitting device, which again is well known to those skilled in the art.

Figure 5:
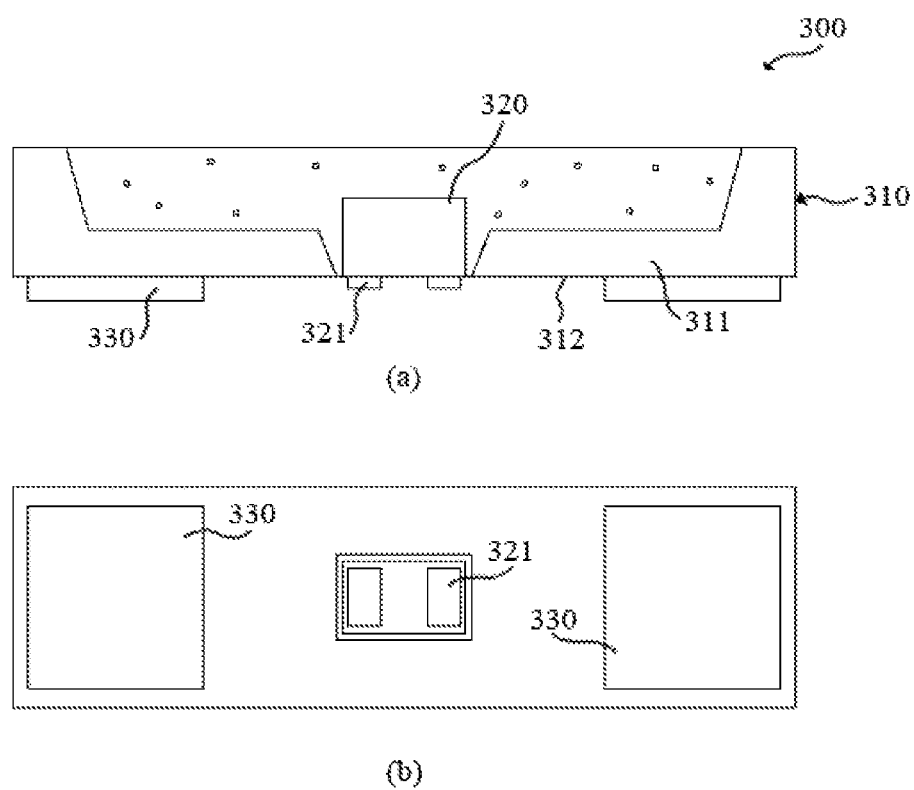
FIG. 5 shows another exemplary embodiment of a semiconductor light emitting device according to the present disclosure.

FIG. 5 shows another exemplary embodiment of a semiconductor light emitting device 300 according to the present disclosure.

The semiconductor light emitting device 300 includes a bonding part 330. Apart from the bonding part 330, the semiconductor light emitting device 300 has the same configurational features with the semiconductor light emitting device 200 shown in FIG. 4. The bonding part 330 is located on the lower face 312 of the bottom part 311 of the body 310, while keeping a distance from the electrode 321 of the semiconductor light emitting chip 320 that is exposed towards the lower face 312 of the bottom part 311 of the body 310. The presence of the bonding part 330 in addition to the electrode 321 contributes to an improved bonding force between the semiconductor light emitting device 300 and an external substrate. The bonding part 330 may be made of a metal. For instance, the bonding part 330 may be made of one of Ag, Cu and Au. The bonding part 330 may also be made of a combination of at least two metals. For instance, it can be made of a combination of Ni and Co, a combination of Cr and Co, or a combination of Ti and Co. The bonding part 330 may be obtained in various combinations of metals and such modification should be easily realized by those skilled in the art. FIG. 5(b), which is a bottom view of FIG. 5(a), clearly shows the layout of the electrodes 321 and the bonding part 330. Although not shown, if necessary, it is also possible that the bonding part 330 may abut against the electrode 321 of the semiconductor light emitting chip 320 and perform the functions of an electrode.

Figure 6:
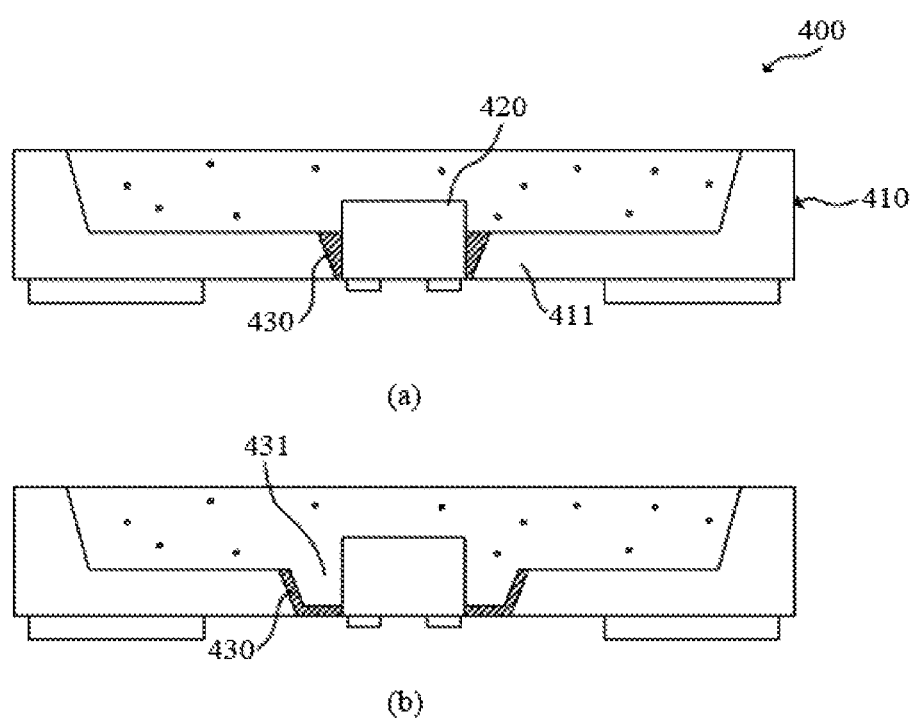
FIG. 6 shows yet another exemplary embodiment of a semiconductor light emitting device according to the present disclosure.

FIG. 6 shows yet another exemplary embodiment of a semiconductor light emitting device 400 according to the present disclosure.

The semiconductor light emitting device 400 has a reflective substance 430 between the bottom part 11 of the body 410 and the semiconductor light emitting chip 420. Apart from the reflective substance 430, the semiconductor light emitting device 400 has the same configurational features with the semiconductor light emitting device 300 shown in FIG. 5. As the reflective substance 430 is provided on each of the lateral faces of the semiconductor light emitting chip 420 and reflects lights coming out of the lateral faces of the semiconductor light emitting chip 420, the efficiency of light extraction of the semiconductor light emitting device 400 may be increased. White reflective substance is suitable for the reflective substance 430. For instance, the reflective substance 420 may be a white silicone resin. Also, the reflective substance 430 may be provided in such a way that a space 431 is created between the reflective substance 430 and the semiconductor light emitting chip 420, as shown in FIG. 6(b).

Figure 7:
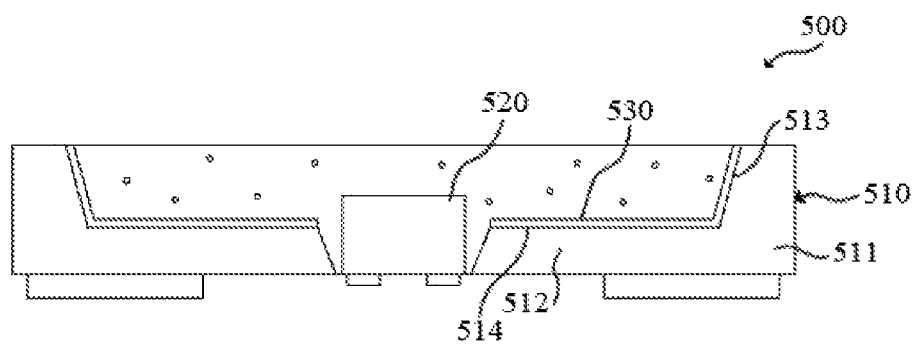
FIG. 7 shows yet another exemplary embodiment of a semiconductor light emitting device according to the present disclosure.

FIG. 7 shows yet another exemplary embodiment of a semiconductor light emitting device 500 according to the present disclosure.

Figure 3:
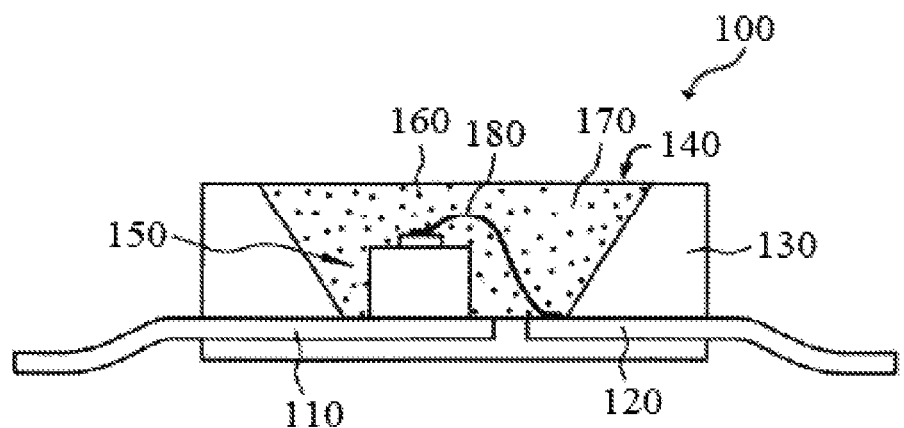
FIG. 3 shows one exemplary embodiment of a semiconductor light emitting device in the prior art.

The semiconductor light emitting device 500 includes a reflecting layer 530 formed at at least one of the inner faces 513 of the side wall 511 of the body 510 and the upper face 514 of the bottom part 512 of the body 510. Apart from the reflective substance 530, the semiconductor light emitting device 500 has the same configurational features with the semiconductor light emitting device 300 shown in FIG. 5. The reflecting layer 530 can be formed all over the upper face 514 of the bottom part 512. The reflecting layer 530 may be made of Al, Ag, a DBR (Distributed Bragg Reflector), a high-reflection white substance or the like, for example. Particularly, in the conventional semiconductor light emitting device 100 as shown in FIG. 3, since the semiconductor light emitting chip 150 should be bonded to the lead frames 110 and 120, a reflecting layer made of a metal with high reflectivity could not be formed all over the upper faces of the lead frames 110 and 120, to which the semiconductor light emitting chip 150 is bonded, due to an electrical short. On the contrary, in the present disclosure, there is no lead frame that is bonded to the semiconductor light emitting chip 520, and the semiconductor light emitting chip 520 is not present on the upper face 514 of the bottom part 512. As a result, the reflecting layer 530 made of a metal with high reflectivity can be formed all over the upper face 514 of the bottom part 512. With the reflecting layer 530 made of a metal with high reflectivity formed all over the upper face 514 of the bottom part 512, the efficiency of light extraction of the semiconductor light emitting device 500 can be increased. Although not shown, the reflecting layer 530 may be provided on the lateral faces of a hole.

Figure 8:
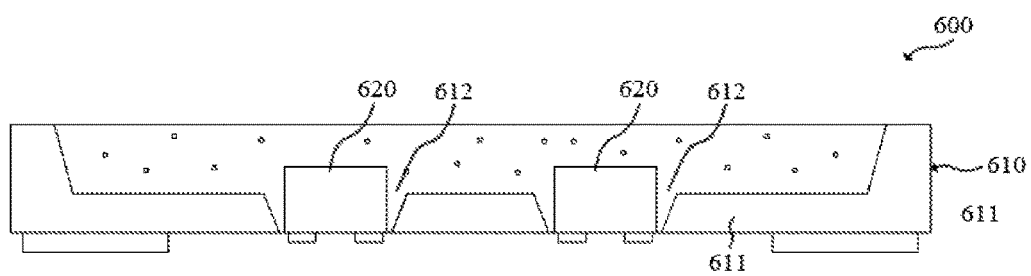
FIG. 8 shows yet another exemplary embodiment of a semiconductor light emitting device according to the present disclosure.

FIG. 8 shows yet another exemplary embodiment of a semiconductor light emitting device 600 according to the present disclosure.

The semiconductor light emitting device 600 has plural holes 612 formed in the bottom part 611 of the body 610, and each of the holes 612 receives a semiconductor light emitting chip 620. Apart from these plural holes 612, with each of the holes 612 receiving an individual semiconductor light emitting chip 620, the semiconductor light emitting device 600 has the same configurational features with the semiconductor light emitting device 300 shown in FIG. 5. While FIG. 8 illustrates two holes, it is possible to have more than two holes. In addition, the semiconductor light emitting chips 620 placed in the respective holes 612 may emit lights of different colors.

Figure 9:
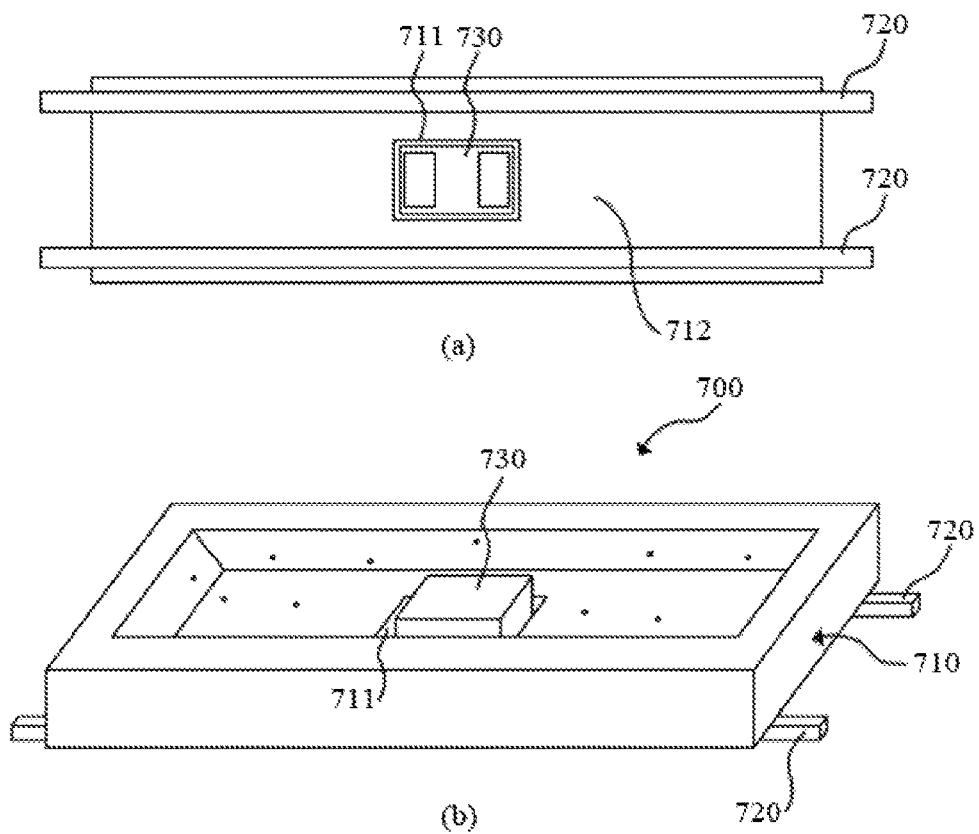
FIG. 9 shows yet another exemplary embodiment of a semiconductor light emitting device according to the present disclosure.

FIG. 9 shows yet another exemplary embodiment of a semiconductor light emitting device 700 according to the present disclosure. FIG. 9(a) is a bottom view, and FIG. 9(b) is a perspective view.

The semiconductor light emitting device 700 has a reinforcement member 720. Apart from the reinforcement member 720, the semiconductor light emitting device 700 has the same configurational features with the semiconductor light emitting device 200 shown in FIG. 4. The semiconductor light emitting device 700 may have plural reinforcement members 720. When two reinforcement members 720 are provided as shown in FIG. 9, a hole 711 and a semiconductor light emitting chip 730 placed in the hole 711 may be positioned between the reinforcement members 720. It is desirable that the reinforcement members 720 and the hole 711 are arranged in a non-overlapped fashion. The reinforcement members 720 can resolve issues like bending of the body 710 or breaking of the body 710 that results from the bending. The reinforcement members 720 are preferably made of a metal. The lead frame described in FIG. 3 may also be used as the reinforcement member 720. Moreover, the reinforcement member 720 positioned as shown in FIG. 9(a) and those reinforcement member 720 positioned as shown in FIG. 10(b) and FIG. 10(c) may function as a bonding part described in FIG. 5.

Figure 10:
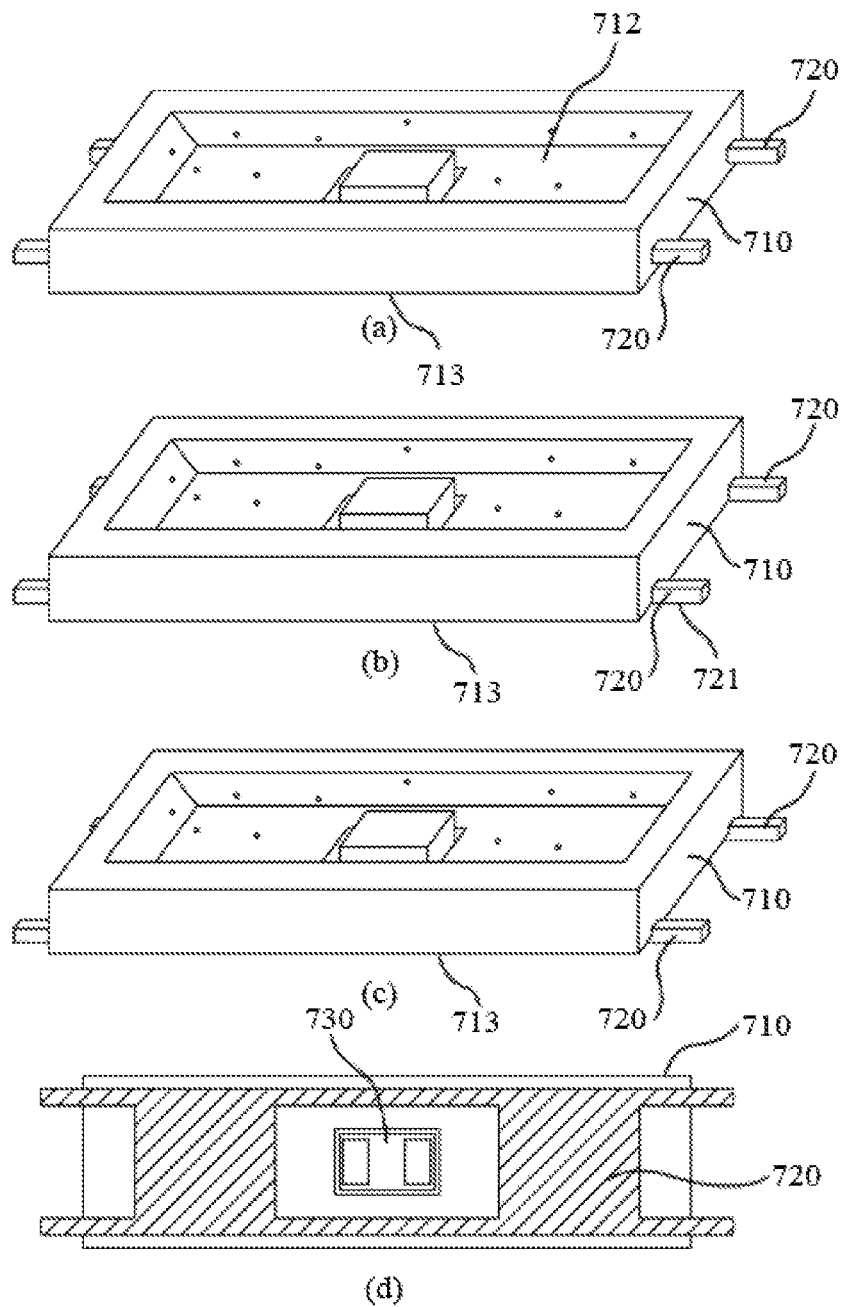
FIG. 10 shows various exemplary representations of a reinforcement member in a semiconductor light emitting device according to the present disclosure.

FIG. 10 shows various exemplary representations of a reinforcement member in a semiconductor light emitting device according to the present disclosure. FIG. 10(a) through FIG. 10(c) are perspective views, and FIG. 10(d) is a bottom view.

FIG. 10(a) through FIG. 10(c) are various exemplary representations of the reinforcement member 720 placed in different locations, such as, between the upper face 712 and the lower face 713 of the bottom part of the body 710. In particular, FIG. 10(a) shows that the reinforcement members 720 are completely inserted into the body 710. FIG. 10(b) shows that the reinforcement members 720 are arranged in a way that the lower faces 721 of the reinforcement members 720 are on the same level with the lower face 713 of the bottom part of the body 710. FIG. 10(c) shows that the reinforcement members 720 are arranged in a way that part of each reinforcement member 720 is protruded from the lower face 713 of the bottom part of the body 710. FIG. 10(d) shows that the reinforcement members 720 are formed along the length and width of the body 710, which is different from the reinforcement members 720 formed only along the length of the body 710. That is to say, it is desirable to form the reinforcement members 720 as wide as possible without overlapping with the hole in the body 710, in order to resolve issues like bending of the body 710 or breaking of the body 710 that results from the bending.

Figure 11:
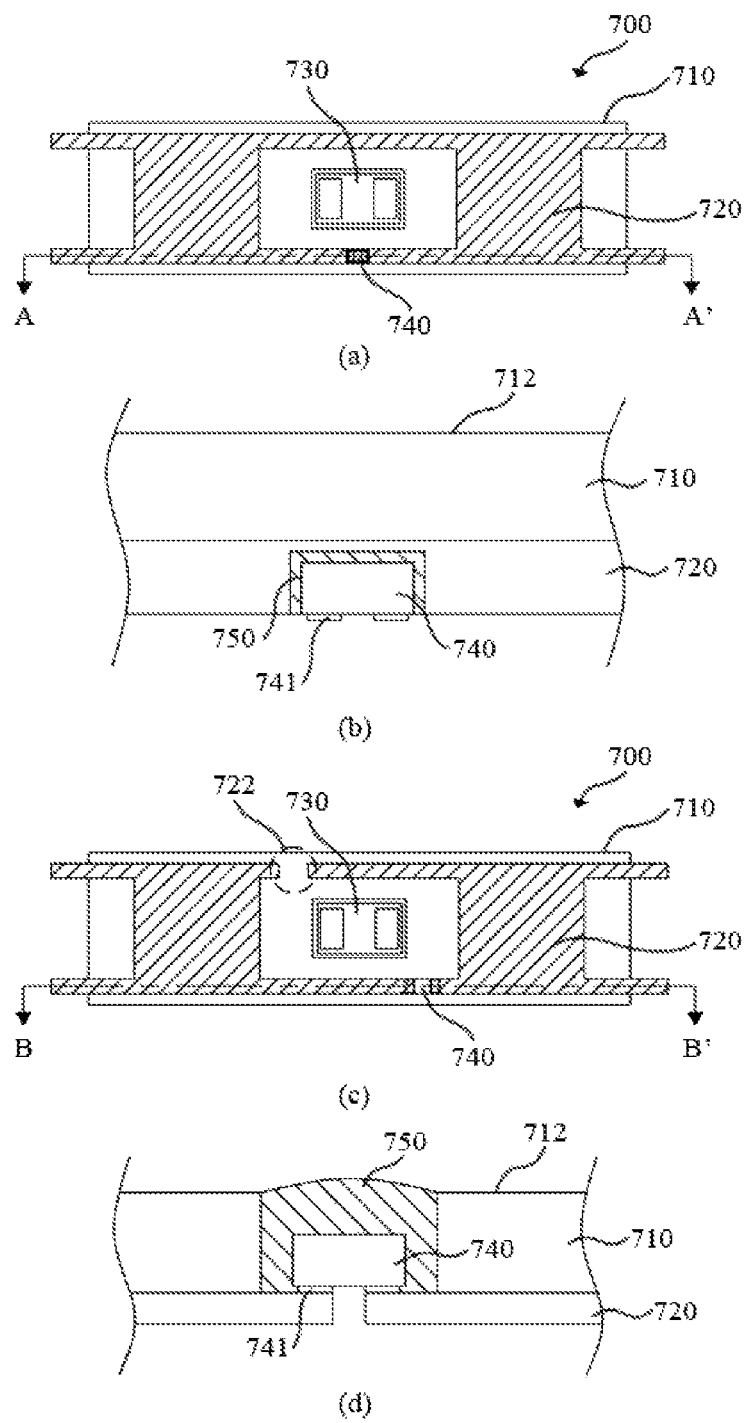
FIG. 11 shows yet another exemplary embodiment of a semiconductor light emitting device according to the present disclosure.

FIG. 11 shows yet another exemplary embodiment of a semiconductor light emitting device 700 according to the present disclosure. FIG. 11(a) and FIG. 11(c) are bottom views, FIG. 11(b) is a sectional view taken along line AA', and FIG. 11(d) is a sectional view taken along line BB'.

The semiconductor light emitting device 700 has a reinforcement member 720, and the reinforcement member 720 contains therein a protecting element 740 (e.g., a Zener diode or a PN diode) for protecting the semiconductor light emitting chip 730 from static electricity or a reverse current, as shown in FIG. 11(a) and FIG. 11(b). Also, the protecting element 740 is inserted in the reinforcement member 720 as shown in FIG. 11(b). The protecting element 740 is all covered with a white silicone resin 750 for example, except for electrodes 741 thereof. To clarify the locational relationship of the protecting element 740, the upper face 712 of the bottom part of the body 710 is also depicted. However, such a small protecting element 740 can make it difficult to mount the protecting element 740 directly onto the electrodes of an external substrate. To overcome this, the protecting element 740 may be inserted into the body 710 as illustrated in FIG. 11(c) and FIG. 11(d). As such, the electrodes 741 of the protecting element 740 are placed on the reinforcement member 720 in a shorted state and electrically connected with the reinforcement member 720. The protecting element 740 is covered with a white silicone resin 750. The reinforcement members 720, together with the semiconductor light emitting chip 730, are connected to the electrodes of an external substrate. To avoid a short, the reinforcement member as shown in FIG. 11(c) is shorted 722. Those protecting elements 740 shown in FIG. 11(a) and FIG. 11(c) are electrically connected in anti-parallel with the semiconductor light emitting chip 730 through the electrodes of an external substrate. In particular, FIG. 11(a) shows that the protecting element 740 is directly electrically connected with an external substrate, while FIG. 11(c) shows that the protecting element 740 is electrically connected with an external substrate via the reinforcement member 720. Those skilled in the art can easily conceive such an electrode array of an external substrate that allows electrical anti-parallel connection between the semiconductor light emitting chip 730 and the protecting element 740 as illustrated in FIG. 11(a) and FIG. 11(c).

Figure 12:
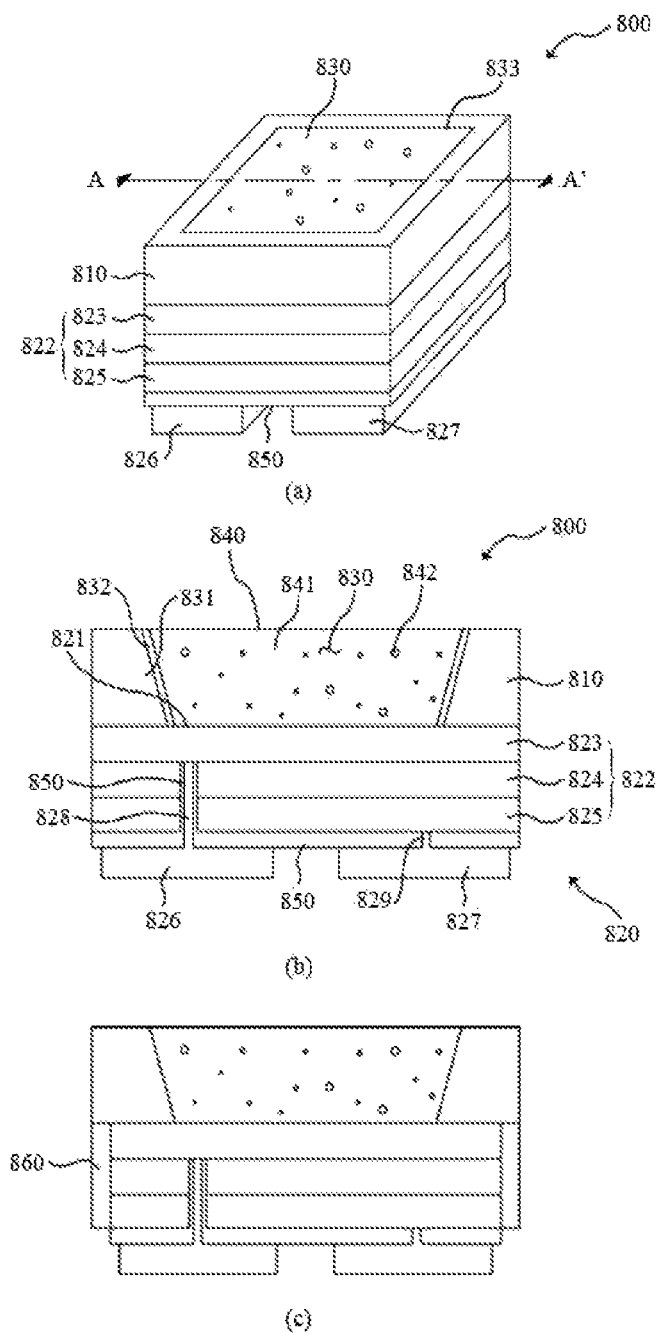
FIG. 12 shows exemplary representations of a semiconductor light emitting chip used in a semiconductor light emitting device according to the present disclosure.

FIG. 12 shows exemplary representations of a semiconductor light emitting chip 800 used in a semiconductor light emitting device according to the present disclosure.

FIG. 12(a) is a perspective view, and FIG. 12(b) is a sectional view taken along line AA'.

The semiconductor light emitting chip 800 for use in a semiconductor light emitting device according to the present disclosure includes an opaque growth substrate 810 and a semiconductor light emitting part 820.

Figure 1:
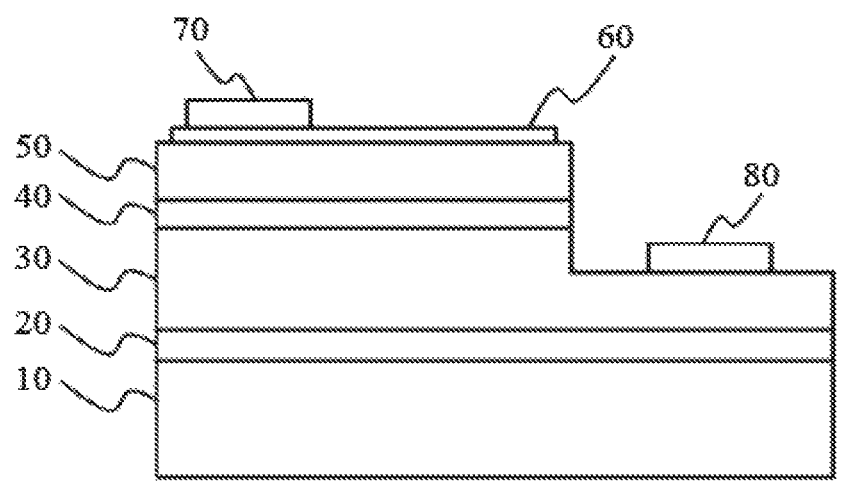
FIG. 1 shows an exemplary embodiment of a semiconductor light emitting chip in the prior art.
Figure 2:
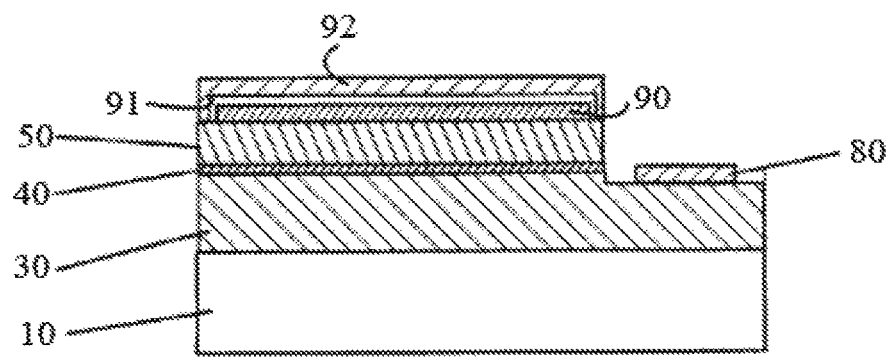
FIG. 2 shows another exemplary embodiment of a semiconductor light emitting chip disclosed in U.S. Pat. No. 7,262,436.

The opaque growth substrate 810 can have a cavity 830, which exposes the upper side 821 of plural semiconductor layers 822. As the opaque growth substrate 810 is non-light transmissive, light from the semiconductor light emitting part 820 escapes through the cavity 830. The cavity 830 can be obtained by an etching process. Lateral faces 831 of the cavity 830 are preferably slanted to reflect and expel the light from the semiconductor light emitting part 820 out upwards. Also, the lateral faces 831 of the cavity 830 can have a reflecting layer 832 for increasing the light reflectivity. Any material having high reflectivity may be used for the reflecting layer 832. Examples of such a material include Al, Ag, a DBR and the like. Moreover, the cavity 830 can be filled with a light-transmitting encapsulating member 840. The light-transmitting encapsulating member 840 can contain a resin 841 and a wavelength converting material 842. Any material (e.g., pigments, dyes or the like) can be used for the wavelength converting material 842, provided that it converts light emitted from the semiconductor light emitting part 820 into light having a different wavelength, yet it is desirable to use phosphors (e.g., YAG, $(Sr,Ba,Ca)_2SiO_4$:Eu or the like) in terms of the efficiency of light conversion. Examples of the resin 841 may include epoxy resins, silicone resins and the like. The light-transmitting encapsulating member 840 may further contain a light-scattering material. The opaque growth substrate 810 is preferably a silicone growth substrate. The semiconductor light emitting part 820 includes plural semiconductor layer 822, a first electrode 826 and a second electrode 827. The plural semiconductor layers 822 includes a first semiconductor layer 823 having a first conductivity, which grows at the lower side of the opaque growth substrate 810; a second semiconductor layer 825 having a second conductivity different from the first conductivity; and an active layer 824 interposed between the first and second semiconductor layers, which generates light by electron-hole recombination. Although not shown, if necessary, additional layers including a buffer layer may be provided as well. While the first semiconductor layer 823 may be the upper side 821 of the plural semiconductor layers 822 to be exposed through the cavity 830, if a buffer layer is present, the buffer layer may be the upper side 821 of the plural semiconductor layers 822 to be exposed. The first electrode 826 is electrically communicated with the first semiconductor layer 823 and provides electrons or holes. Even though the first electrode 826 can be directly connected to the first semiconductor layer 823 as shown in FIG. 2, a separate electrical pass 828 may be provided to enable electrical communication between the first electrode 826 and the first semiconductor layer 823. Meanwhile, the semiconductor light emitting part 820 can include dielectric layers 850 which are formed between the second semiconductor layer 825 and the first electrode 826 and on the lateral faces of the electrical pass 828, such that a contact between the first electrode 826 and the second semiconductor layer 825 can be prevented when the first electrode 826 is in electrical communication with the first semiconductor layer 823 through the electrical pass 828, The second electrode 827 is electrically communicated with the second semiconductor layer 825 and provides electrons or holes. If the dielectric layer 850 is also provided between the second semiconductor layer 825 and the second electrode 827, the second electrode 827 can have an electrical pass 829 for electrically connecting the second electrode 827 and the second semiconductor layer 825. The first electrode 826 and the second electrode 827 are arranged below the plural semiconductor layers 822. Also, to increase the reflectivity, the dielectric layer 850 formed between the semiconductor layers 828 and the first and second electrodes 826 and 827 can serve as a reflecting layer. With the dielectric layers 850 serving as reflecting layers, it is possible to reflect even the light that goes out through a portion where neither the first electrode 826 nor the second electrode 827 are formed. When the dielectric layer 850 has a reflecting function, it can be referred to as a non-conductive reflective film 850. Details of the non-conductive reflective film are disclosed in Korean Patent No. 10-1368720. Although not shown, a metallic reflecting layer can be provided on the plural semiconductor layers 222. As metallic reflecting layer forming methods are well known to those skilled in the art, they would not be explained here. The semiconductor light emitting chip 800 in FIG. 12(c) further includes reflection walls 860 on the sides of the semiconductor light emitting part 820, which reflect light. In presence of the opaque growth substrate 810, the reflection walls 860, and the dielectric layers 850 with a reflecting function, light coming out of the semiconductor light emitting chip 800 can escape only through the cavity 830

Figure 13:
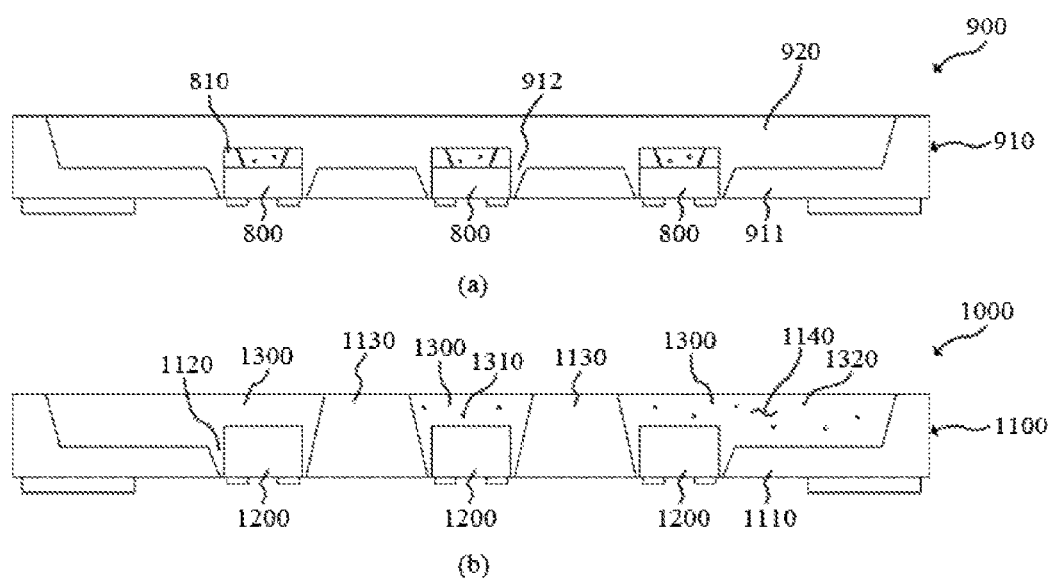
FIG. 13 shows yet other exemplary embodiments of a semiconductor light emitting device according to the present disclosure.

FIG. 13 shows exemplary embodiments of a semiconductor light emitting device according to the present disclosure.

FIG. 13(a) is a representation of the semiconductor light emitting device 900 according to the present disclosure, which is capable of generating white lights having diverse colors and diverse color temperatures and has a high color render index.

The semiconductor light emitting device 900 shown in FIG. 13(a) has plural holes 912 formed in the bottom part 911 of the body 910, and each of the holes 912 receives the semiconductor light emitting chip 800 shown in FIG. 12. Light coming out of the semiconductor light emitting chip 800 escapes through the cavity 830 of the opaque growth substrate 810. Particularly when the reflection walls 860 are placed on the sides of the semiconductor light emitting chip 800 as shown in FIG. 12(c), light coming out of the semiconductor light emitting chip 800 can escape only through the cavity 830. Further, in order to cause the semiconductor light emitting chips 800 received in their respective holes 912 to emit lights different from each other, the cavity 830 of the semiconductor light emitting chips 800 received in their respective holes 912 may contain wavelength converting materials 842 that emit different colors. For instance, if three semiconductor light emitting chips 800 are provided as shown in FIG. 13(a), one of them may emit blue light, another may emit green light, and the other may emit red light. In particular, when light from each of the semiconductor light emitting chips 800 can escape only through the cavity 830 or when a reflective substance (not shown) is present between the semiconductor light emitting chip 800 and the bottom part 911 as shown in FIG. 6(a), lights emitted from the plural semiconductor light emitting chips 800 may not interfere with each other. More specifically, the wavelength converting material 842 contained in the cavity 830 of each semiconductor light emitting chip 800 may not be affected by those lights. With this configuration, the resulting semiconductor light emitting device can generate diverse colors with high purity and white lights with different color temperatures, and have a high color render index. In addition, since the wavelength converting material 842 is contained in the semiconductor light emitting chip 800, the encapsulating member 920 may not include the wavelength converting material. The other configurational features not described in reference to FIG. 13(a) are the same as those of the semiconductor light emitting device 600 shown in FIG. 8.

FIG. 13(b) is another representation of a semiconductor light emitting device 1000 which has plural holes 1120 formed in the bottom part 1110 of the body 1100, and each of the holes 1120 can receive a semiconductor light emitting chip 1200. Also, in the body 1100, barriers 1130 are arranged between the holes 1120. With these barriers 1130, plural cavities 1140 are formed in correspondence to the plural holes 1120. Different wavelength converting materials 1310 and 1320 may be used in the plural cavities 1140. For instance, as shown in FIG. 13(b), three semiconductor light emitting chips 1200 emitting blue light are placed in their respective holes 1120. An encapsulating member 1300 free of a wavelength converting material can be used in one cavity 1140, an encapsulating member 1300 containing a wavelength converting material 1310 that is excited by blue light and emits green light can be used in another cavity 1140, and an encapsulating member 1300 containing a wavelength converting material 1320 that is excited by blue light and emits red light can be used in the other cavity 1140. Under the presence of the barriers 1130, lights from the plural cavities 1140 are not interfered with each other. More specifically, the wavelength converting materials 1310 and 1320 contained in the respective cavities 1140 may not be affected by those lights coming out of the plural cavities 1140. With this configuration, the resulting semiconductor light emitting device can generate diverse colors with high purity and white lights with different color temperatures, and have a high color render index. The other configurational features not described in reference to FIG. 13(b) are the same as those of the semiconductor light emitting device 600 shown in FIG. 8.

Figure 14:
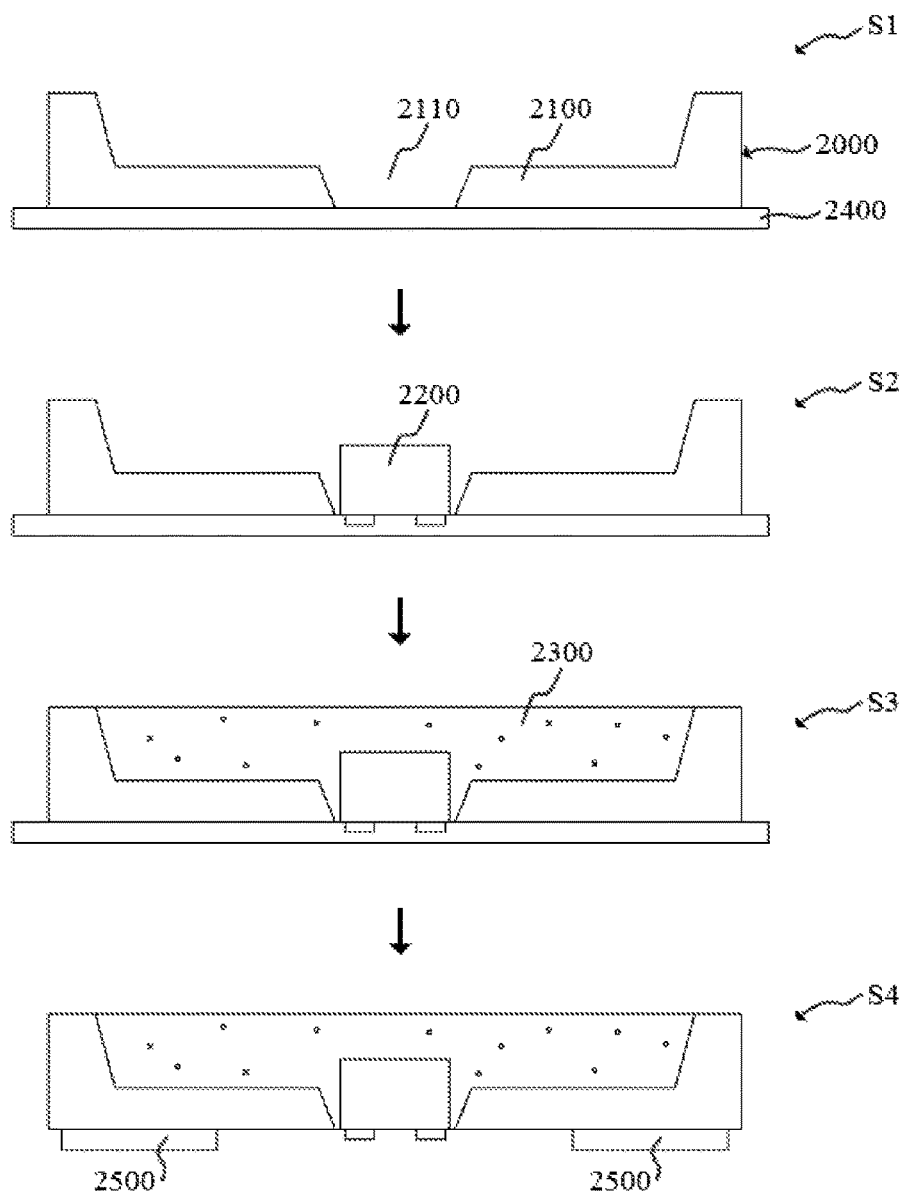
FIG. 14 diagrammatically shows a method for manufacturing a semiconductor light emitting device according to the present disclosure.

FIG. 14 diagrammatically shows a method for manufacturing a semiconductor light emitting device according to the present disclosure.

First, in step S1, a body 2000 having a hole 2110 formed in the bottom part 2100 is prepared. The body 2000 can be obtained by injection molding. In step S2, a semiconductor light emitting chip 2200 is placed in the holes 2100. Next, in step S3, the semiconductor light emitting chip 2200 is covered with an encapsulating member 2300 in order to fix the semiconductor light emitting chip 2200 to the body 2000. Before fixing the semiconductor light emitting chip 2200 using the encapsulating member 2300, a temporary fixing plate 2400 may be used to immobilize the semiconductor light emitting chip 2200. Any conventional adhesive tape, e.g., a blue tape, can be used for the temporary fixing plate 2400. After that, in step S4, bonding parts 2500 are formed, after removing the temporary fixing plate 2400 if present. Also, instead of the bonding part 2500, a reinforcement member (not shown) may be formed. If the reinforcement member should be provided on the upper and lower faces of the bottom part of a body, it may be added while preparing a body. Any modification to the sequence of the method for manufacturing a semiconductor light emitting device according to the present disclosure can be made within the scope that would be easily done by those skilled in the art, and such a modification is also intended to be encompassed within the scope of the present disclosure.

Figure 15:
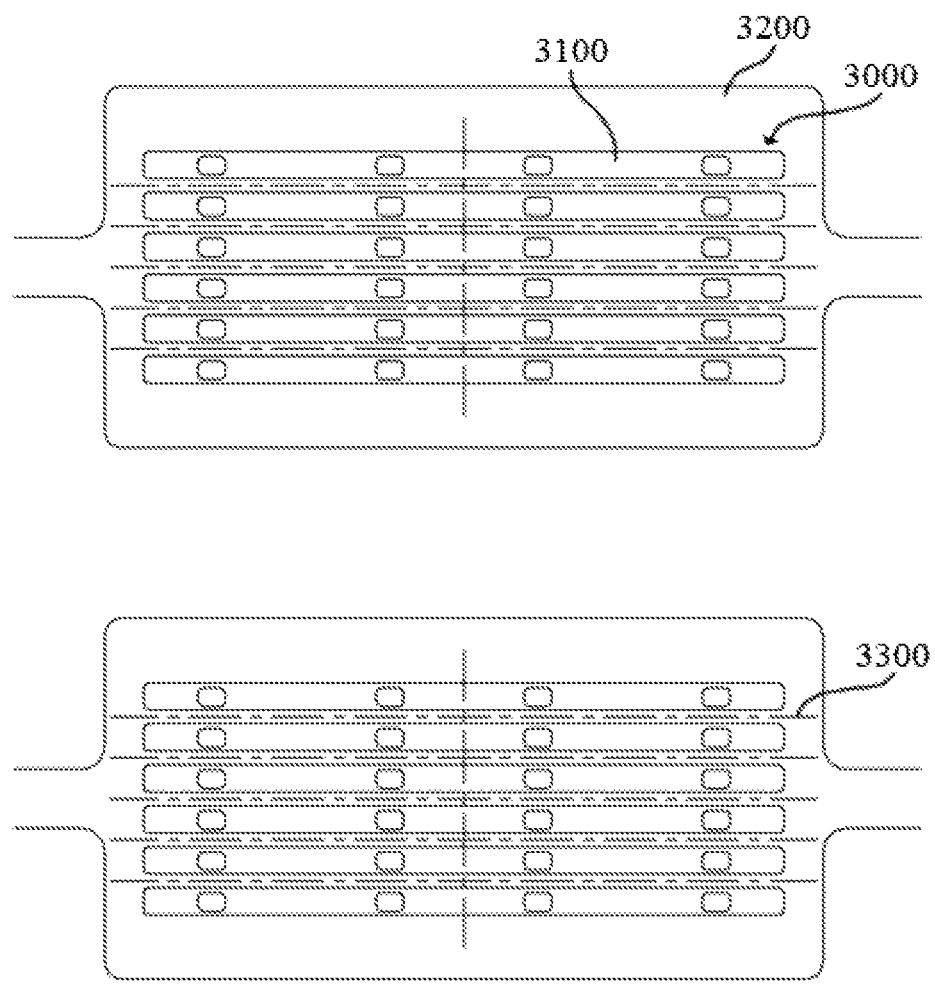
FIG. 15 diagrammatically shows another method for manufacturing a semiconductor light emitting device according to the present disclosure.

FIG. 15 diagrammatically shows another method for manufacturing a semiconductor light emitting device 3000 according to the present disclosure.

Following the manufacturing method represented in FIG. 14, it is possible to manufacture plural semiconductor light emitting devices 3000 all at once, as shown in FIG. 15. For instance, a substrate 3200 with plural bodies 3100 is obtained by injection molding, and then plural semiconductor light emitting devices 3000 can be obtained all together according to the manufacturing method represented in FIG. 14. Individual semiconductor light emitting devices 3000 are then obtained by cutting the substrate along a cutting line 3300.

Figure 16:
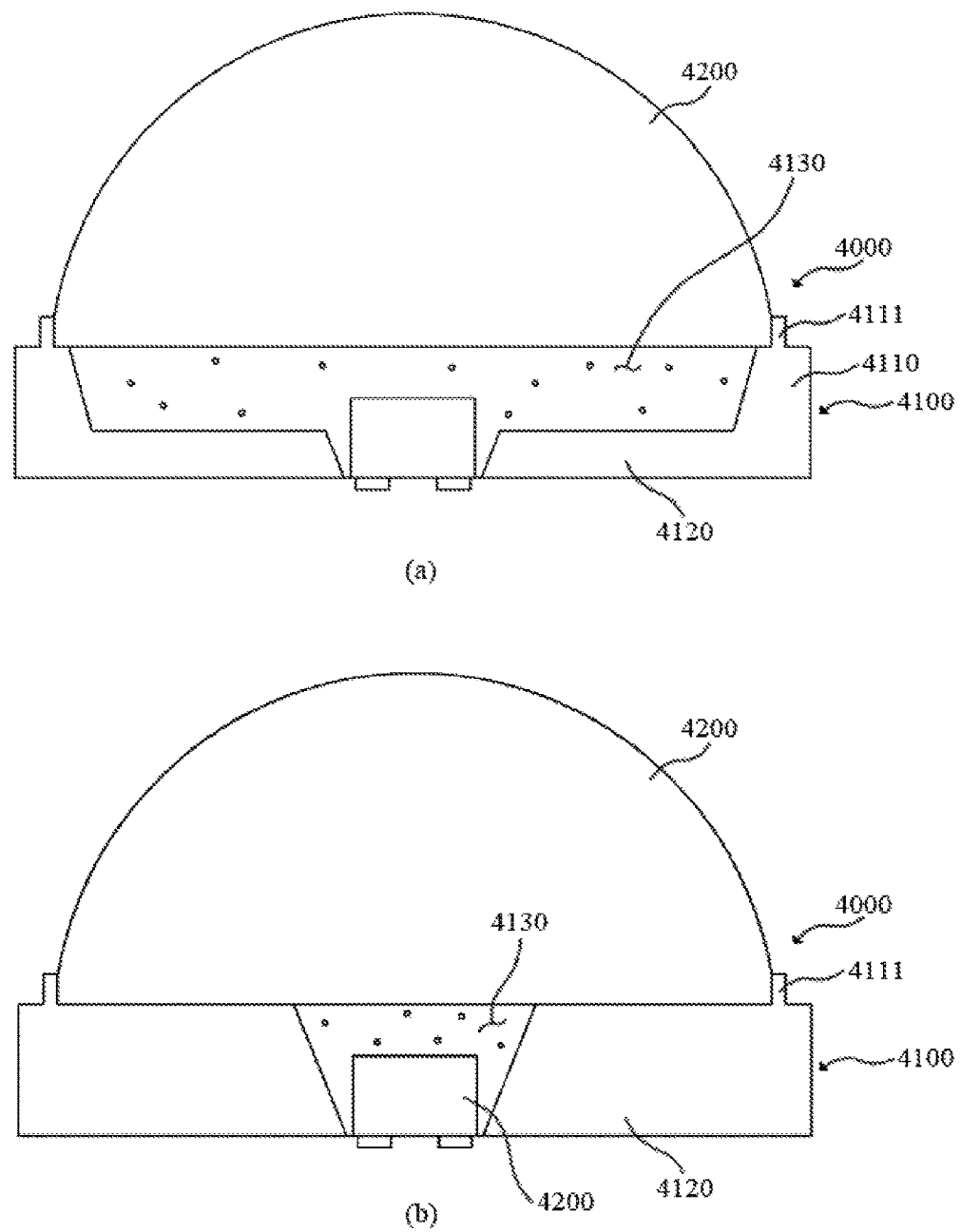
FIG. 16 shows yet other exemplary embodiments of a semiconductor light emitting device according to the present disclosure.

FIG. 16 shows yet other exemplary embodiments of a semiconductor light emitting device 4000 according to the present disclosure.

The semiconductor light emitting device 4000 as shown in FIG. 16(a) includes a body 4100 with a side wall 4110 having a protruded portion 4111, and a lens 4200 formed on the encapsulating member and between the protruded portions 4111. The protruded portion 4111 serve as boundary projections to prevent the lens 4200 being formed from going over the protruded portion 4111 After an encapsulating member is formed in step S3 of FIG. 14, the lens 4200 can be formed using a light-transmitting resin. Meanwhile, the semiconductor light emitting device 4000 as shown in FIG. 16(b) includes a body 4100 with a bottom part 4120 having a protruded portion 4111, and a lens 4200 formed on the encapsulating member and between the protruded portions 4111. In particular, the body 4100 includes only the bottom part 4120 without a side wall, and the bottom part 4120 is formed at a higher height level than the semiconductor light emitting chip 4200. As the lens 4200 allows sufficient light diffusion, there is no need to have such a broad bottom part 4120 and an encapsulating member 4130 for entirely covering the bottom part 4120 as in FIG. 16(a). This reduces the overall material costs. The other configurational features not described in reference to FIG. 16 are the same as those of the semiconductor light emitting device 200 shown in FIG. 4.

Figure 17:
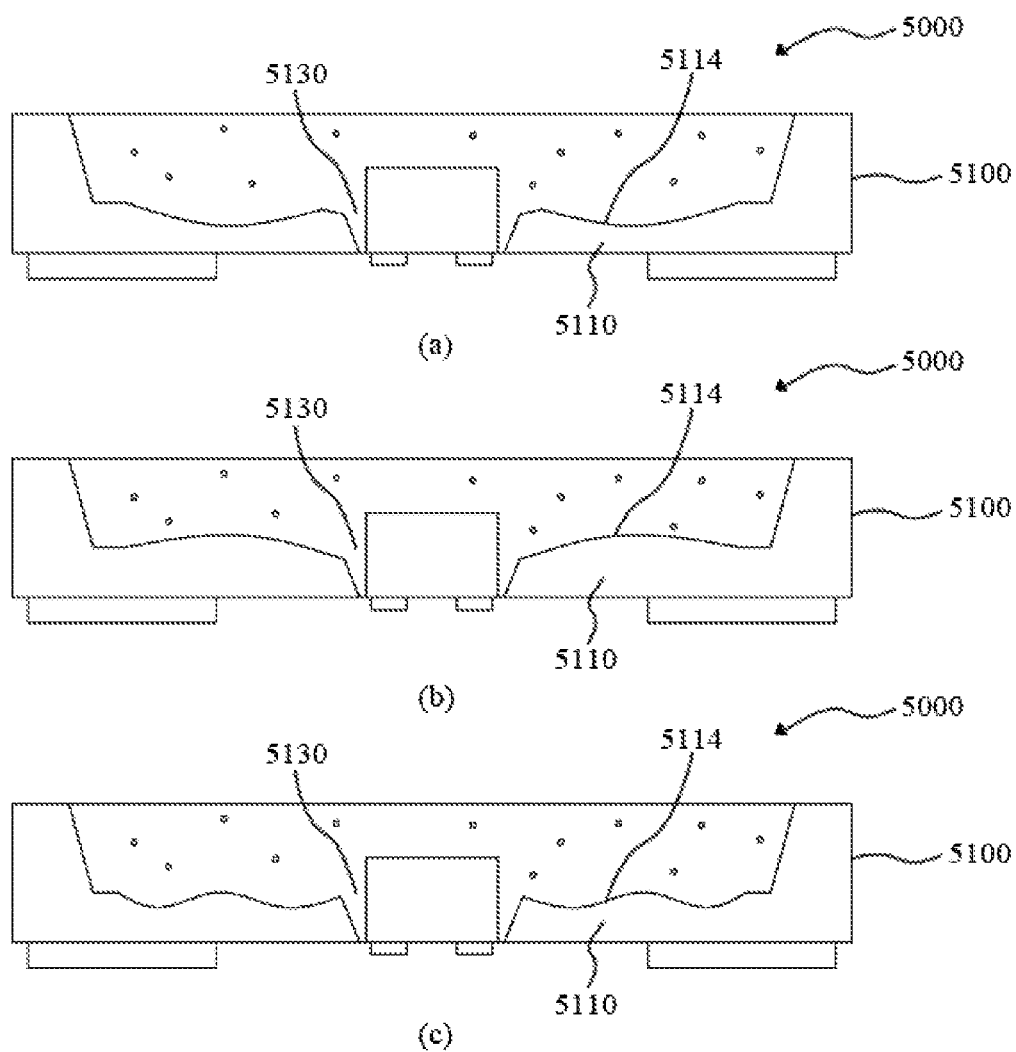
FIG. 17 shows yet other exemplary embodiments of a semiconductor light emitting device according to the present disclosure.

FIG. 17 shows yet other exemplary embodiments of a semiconductor light emitting device 5000 according to the present disclosure.

The semiconductor light emitting device 5000 includes a body 5100 with a bottom part 5110 having at least one of concave and convex portions on the upper face 5111 thereof. In particular, the upper face 5111 of the bottom part 5110 of the body 5100 has a concave portion as shown in FIG. 17(a), or a convex portion as shown in FIG. 17(b), or concave and convex portions consecutively as shown in FIG. 17(c). When the upper face of the bottom part has at least one of concave and convex portions, the semiconductor light emitting device 5000 may have an increased light extraction efficiency, and the reason for such an increase in the efficiency of light extraction will be explained later in reference to FIG. 19. The other configurational features not described in reference to FIG. 17 are the same as those of the semiconductor light emitting device 300 shown in FIG. 5.

Figure 18:
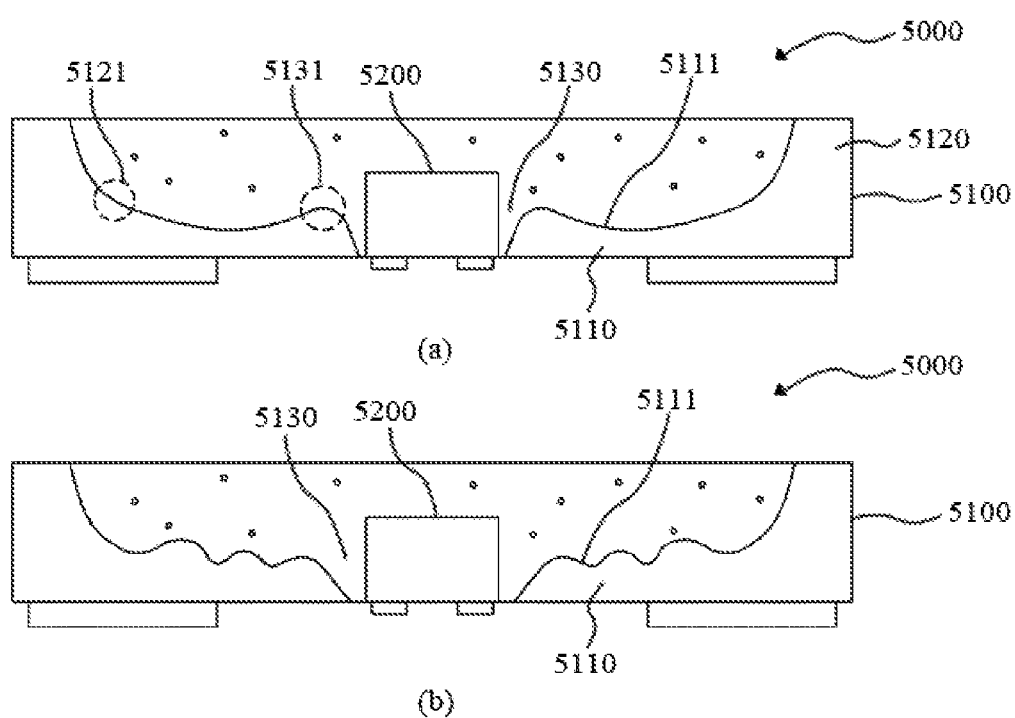
FIG. 18 shows various exemplary representations of the upper face of the bottom part of the body of a semiconductor light emitting device according to the present disclosure.

FIG. 18 shows various exemplary representations of the upper face of the bottom part of the body of a semiconductor light emitting device 5000 according to the present disclosure.

Referring to FIG. 18(a), a connected portion 5121 where a concave portion of the upper face 5111 of the bottom part 5110 of the body 5100 and the side wall 5120 of the body 5100 are connected is not flat, but curved. Also, a connected portion 5131 where the concave portion of the upper face 5111 of the bottom part 5110 of the body 5100 and a hole 5130 of the body 5100 is not flat, but curved. Because these connected portions 5121 and 5131 are not flat, but curved, the efficiency of light extraction can be increased. Referring next to FIG. 18(b), the upper face 5111 of the bottom part 5110 of the body 5100 can have plural concave portions, with a concave portion getting smaller towards a semiconductor light emitting chip 5200. A larger concave portion can cause a higher light extraction efficiency. Thus, with a larger concave portion being farther from the semiconductor light emitting chip 5200 and a smaller concave portion being closer to the semiconductor light emitting chip 5200, generally uniform light can be emitted from the semiconductor light emitting device 5000. Although not shown in FIG. 18(a) and FIG. 18(b), the convex portion also results in similar features with ones of the concave portion.

Figure 19:
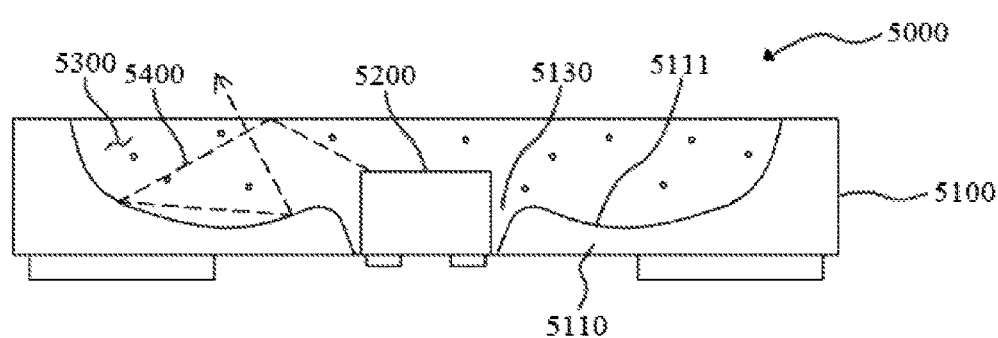
FIG. 19 diagrammatically describes principles of improved light extraction when the upper face of the body of a semiconductor light emitting device according to the present disclosure has at least one of concave and convex portions.

FIG. 19 diagrammatically describes principles of improved light extraction when the upper face of the body of a semiconductor light emitting device 5000 according to the present disclosure has at least one of concave and convex portions.

Light 5400 from a semiconductor light emitting chip 5200 in the semiconductor light emitting device 5000 is reflected from a boundary 5500 between an encapsulating member 5300 and outside. This reflected light 5400 can be reflected by a concave portion of the upper face 5111 of the bottom part 5110 of the body 5100 in a dotted line and then escape from the semiconductor light emitting device 5000. In other words, light that might have been captured inside the semiconductor light emitting device 5000 when the upper face 5111 of the bottom part 5110 is flat can still escape from the semiconductor light emitting device 5000 as the upper face 5111 of the bottom part 5110 has at least one of convex and concave portions, and this will bring about an increased efficiency of light extraction. It is more desirable to have a concave portion on the upper face 5111 of the bottom part 5110 in terms of higher light extraction efficiency.

Figure 20:
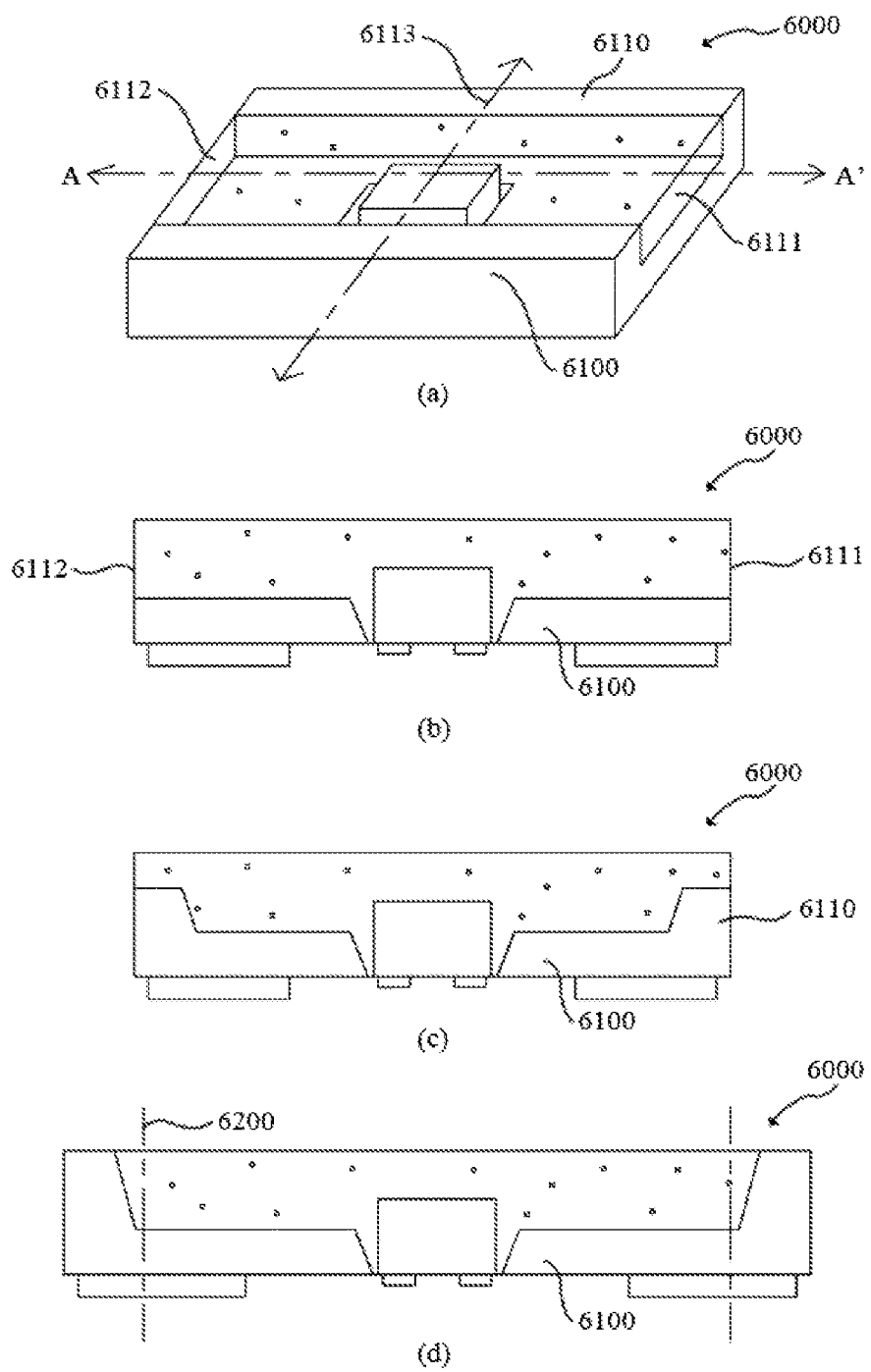
FIG. 20 shows yet another exemplary embodiment of a semiconductor light emitting device according to the present disclosure.

FIG. 20 shows yet another exemplary embodiment of a semiconductor light emitting device 6000 according to the present disclosure. FIG. 20(*a*) is a perspective view. FIG. 20(*b*) is a sectional view taken along line AA', FIG. 20(*c*) is a sectional view of another representation of FIG. 20(*b*), and FIG. 20(*d*) is a sectional view for explaining a manufacturing method of the semiconductor light emitting device.

The semiconductor light emitting device 6000 has two open zones 6111 and 6112 in a side wall 6110 of the body 6100. These two open zones 6111 and 6112 are disposed facing each other. In particular, when the body 6100 has short direction 6113 and long direction 6114, it is desirable that the two open zones 6111 and 6112 face each other on the side of the long direction 6114 of the body 6100. This semiconductor light emitting device 6000 is capable of emitting light from three sides, i.e. the upper side as well as the open zones 6111 and 6112 of the semiconductor light emitting device 6000. Meanwhile, instead of completely removing the side wall 6110 of the open zones 6111 and 6112, part of them may be preserved as shown in FIG. 20(*c*), thereby adjusting the angle or intensity of light escaping through the lateral faces of the semiconductor light emitting device 6000. According to the manufacturing method, after step S4 in FIG. 14, the semiconductor light emitting device 6000 is then obtained by cutting along cutting lines 6200 as shown in FIG. 20(*d*). The other configurational features not described in reference to FIG. 20 are the same as those of the semiconductor light emitting device 300 shown in FIG. 5. While FIG. 20 illustrated two open zones, if necessary, more than two open zones, or even one open zone can be present.

Figure 21:
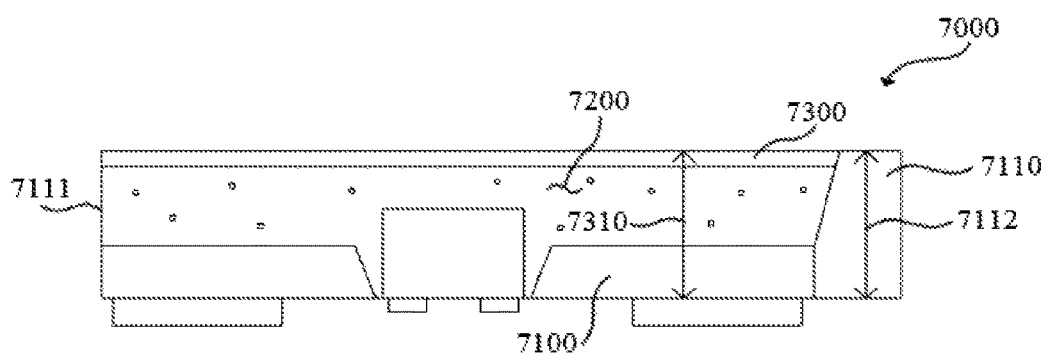
FIG. 21 shows yet another exemplary embodiment of a semiconductor light emitting device according to the present disclosure.

FIG. 21 shows yet another exemplary embodiment of a semiconductor light emitting device 7000 according to the present disclosure.

The semiconductor light emitting device 7000 includes a body 7100 with a side wall 7110 having one open zone 7111, an encapsulating member 7200 and a reflecting layer 7300 on the encapsulating member 7200. The reflecting layer 7300 can be made of Al, Ag, a DBR, or a high-reflection white substance, for example. Moreover, in order to prevent light from escaping between the reflecting layer 7300 and the side wall 7110, it is desirable to have the height level 7310 of the reflecting layer 7300 equal to or lower than the height level 7112 of the side wall 7110. The semiconductor light emitting device 7000 can emit light only through the open zones 7111, thereby limiting its emission to the lateral faces only. While FIG. 21 illustrates one open zone, if necessary, more than one open zone can be present. The other configurational features not described in reference to FIG. 21 are the same as those of the semiconductor light emitting device 300 shown in FIG. 5. According to the manufacturing method, after step S3 in FIG. 14, a reflecting layer is formed on the encapsulating member, and the semiconductor light emitting device 7000 is then obtained by cutting along cutting lines 6200 as shown in FIG. 20(*d*).

The following describes diverse exemplary embodiments of the present disclosure.

(1) A semiconductor light emitting device, comprising: a body, which has a bottom part with at least one hole formed therein, a side wall, and a cavity defined by the bottom part and the side wall; a semiconductor light emitting chip, which is placed in each hole and includes plural semiconductor layers adapted to generate light by electron-hole recombination and electrodes electrically connected to the plural semiconductor layers; and an encapsulating member provided at least to the cavity to cover the semiconductor light emitting chip, wherein the electrodes of the semiconductor light emitting chip are exposed towards the lower face of the bottom part of the body.

(2) A semiconductor light emitting device, wherein a reflecting layer is formed at least one of inner faces of the side wall of the body and an upper face of the bottom part of the body.

(3) A semiconductor light emitting device, wherein the reflecting layer is formed all over the upper face of the bottom part.

(4) A semiconductor light emitting device, wherein the reflecting layer is a metallic layer.

(5) A semiconductor light emitting device, wherein the bottom part is formed at a lower height level than the semiconductor light emitting chip.

(6) A semiconductor light emitting device, wherein a reflective substance is arranged between the bottom part and the semiconductor light emitting chip.

(7) A semiconductor light emitting device, wherein the reflective substance is a white reflective resin.

(8) A semiconductor light emitting device, further comprising: a bonding part located on the lower face of the bottom part of the body, while keeping a distance from the electrodes of the semiconductor light emitting chip that is exposed towards the lower face of the bottom part of the body.

(9) A semiconductor light emitting device, wherein the bonding part is made of a metal.

(10) A semiconductor light emitting device, wherein plural holes are formed, semiconductor light emitting chips are placed in the holes respectively and the semiconductor light emitting device further comprises a metallic bonding part located on the lower face of the bottom part of the body, while keeping a distance from the electrodes of the semiconductor light emitting chip that is exposed towards the lower face of the bottom part of the body.

(11) A semiconductor light emitting device, wherein the semiconductor light emitting chips placed in their respective holes emit lights having different colors.

(12) A semiconductor light emitting device, wherein the encapsulating member serves to fix the semiconductor light emitting chip placed in each hole to the body.

(13) A semiconductor light emitting device, wherein the side wall has a height greater than length of the bottom part.

(14) A semiconductor light emitting device, wherein plural holes are formed, and barriers are arranged between the holes.

(15) A semiconductor light emitting device, wherein the hole has slanted lateral faces.

(16) A semiconductor light emitting device, wherein the body has a protruded portion and the semiconductor light emitting device further comprises a lens formed on the encapsulating member and between the protruded parts.

(17) A semiconductor light emitting device, in which at least one open zone is formed in a side wall.

(18) A semiconductor light emitting device, in which two open zones are formed in a side wall, the two open zone facing each other.

(19) A semiconductor light emitting device, in which a bottom part of a body of the semiconductor light emitting device has long direction and short direction, and two open zones are formed facing each other on the side of the long direction of the bottom part of the body.

(20) A semiconductor light emitting device, which includes a reflecting layer formed on an encapsulating member.

(21) A semiconductor light emitting device, in which a reflecting layer formed on an encapsulating member is made of a white reflective substance.

(22) A semiconductor light emitting device, in which a reflecting layer formed on an encapsulating member has a height level equal to or higher than the height level of a side wall.

(23) A semiconductor light emitting device, in which a side wall has one open zone.

(24) A semiconductor light emitting device having a body made of a high-reflection white resin.

(25) A semiconductor light emitting device including: a body which has a bottom part with at least one hole formed therein; a semiconductor light emitting chip which is placed in each hole and includes plural semiconductor layers adapted to generate light by electron-hole recombination and electrodes electrically connected to the plural semiconductor layers; an encapsulating member for covering the semiconductor light emitting chip; and at least one reinforcement member disposed in the body in a way to avoid overlapping with the holes in the bottom part of the body, in which the electrodes of the semiconductor light emitting chip are exposed towards the lower face of the bottom part of the body of the semiconductor light emitting device.

(26) A semiconductor light emitting device, in which two reinforcement members are formed along the length direction of a body of the semiconductor light emitting device, and a hole is formed between the two reinforcement members.

(27) A semiconductor light emitting device, in which a reinforcement member is arranged between the upper and lower faces of the bottom part of a body of the semiconductor light emitting device.

(28) A semiconductor light emitting device, in which the lower face of a reinforcement member is at the same height level with the lower face of the bottom part of a body of the semiconductor light emitting device.

(29) A semiconductor light emitting device, in which part of a reinforcement member is exposed from the lower face of the bottom part of a body of the semiconductor light emitting device.

(30) A semiconductor light emitting device, in which a reinforcement member is placed at the lower face of the bottom part of a body of the semiconductor light emitting device.

(31) A semiconductor light emitting device, in which a reinforcement member is made of a metal.

(32) A semiconductor light emitting device, in which a reinforcement member includes a protecting element.

(33) A semiconductor light emitting device, in which the bottom part of a body of the semiconductor light emitting device includes a protecting element on a reinforcement member.

(34) A semiconductor light emitting device, in which the upper face of the bottom part of a body of the semiconductor light emitting device has at least one of concave and convex portions.

(35) A semiconductor light emitting device, in which the upper face of the bottom part of a body of the semiconductor light emitting device has a concave portion and a convex portion consecutively.

(36) A semiconductor light emitting device, in which the upper face of the bottom part of a body of the semiconductor light emitting device has plural concave portions, and the concave portions get smaller towards the semiconductor light emitting chip.

(37) A semiconductor light emitting device, in which a connected portion where at least one of concave and convex portions formed on the upper face of the bottom part of a body of the semiconductor light emitting device is connected to a hole is not flat.

(38) A semiconductor light emitting device, in which a connected portion where at least one of concave and convex portions formed on the upper face of the bottom part of a body of the semiconductor light emitting device is connected to a side wall is not flat.

According to the present disclosure, a semiconductor light emitting device can be obtained, in which the electrodes of a semiconductor light emitting chip are bonded directly to an external substrate.

Moreover, according to the present disclosure, a semiconductor light emitting device can be obtained, which does not require bonding between lead frames and a flip chip such that no light intensity from the flip chip may be lost due to the bonding between the lead frames and the flip chip.

Further, according to the present disclosure, the efficiency of light extraction can be increased by guiding light that might have been dissipated inside a semiconductor light emitting device to outside the semiconductor light emitting device.

Also, according to the present disclosure, a semiconductor light emitting device capable of emitting light from three sides or lateral faces can be obtained.

DESCRIPTION OF REFERENCE NUMERALS

Semiconductor light emitting device: 100, 200, 300, 400, 500, 600, 700, 900, 1000, 3000, 4000, 5000, 6000, 7000
Semiconductor light emitting chip: 150, 220, 320, 420, 520, 620, 730, 800, 1200, 2200, 5200
Reinforcement member: 720

What is claimed is:

1. A semiconductor light emitting device, comprising:
a body, which has a bottom part with at least one hole formed therein, a side wall, and a cavity defined by the bottom part and the side wall,
a semiconductor light emitting chip, which is placed in each hole and includes plural semiconductor layers adapted to generate light by electron-hole recombination and electrodes electrically connected to the plural semiconductor layers, wherein the semiconductor light emitting chip has a height; and
an encapsulating member provided at least to the cavity to cover the semiconductor light emitting chip,
wherein the electrodes of the semiconductor light emitting chip are exposed towards the lower face of the bottom part of the body,
wherein the bottom part has a length, an upper face, a lower face, and a height, the height of the bottom part measured with respect to the lower face of the bottom part, at each hole the bottom part has a lateral part extending from the lower face to the upper face to define the hole, the lateral part faces the plural semiconductor layers of the semiconductor light emitting chip, and the lateral part is spaced from the semiconductor light emitting chip placed in the hole,
wherein the side wall has a height greater than the height of the bottom part and has an outer face and an inner face, and the cavity is defined by the inner face of the side wall and the upper face of the bottom part; and
wherein each hole formed in the bottom part is larger than the semiconductor light emitting chip so that the encapsulating member is filled within each hole between the bottom part and the semiconductor light emitting chip.

2. The semiconductor light emitting device of claim 1, wherein a reflecting layer is formed at least one of inner faces of the side wall of the body and the upper face of the bottom part of the body.

3. The semiconductor light emitting device of claim 2, wherein the reflecting layer is formed all over the upper face of the bottom part.

4. The semiconductor light emitting device of claim 3, wherein the reflecting layer is a metallic layer.

5. The semiconductor light emitting device of claim 1, wherein the bottom part is formed at a lower height level than the semiconductor light emitting chip.

6. The semiconductor light emitting device of claim 1, wherein a reflective substance is arranged between the bottom part and the semiconductor light emitting chip.

7. The semiconductor light emitting device of claim 6, wherein the reflective substance is a white reflective resin.

8. The semiconductor light emitting device of claim 1, further comprising:
a bonding part located on the lower face of the bottom part of the body, while keeping a distance from the electrodes of the semiconductor light emitting chip that is exposed towards the lower face of the bottom part of the body.

9. The semiconductor light emitting device of claim 8, wherein the bonding part is made of a metal.

10. The semiconductor light emitting device of claim 1, wherein plural holes are formed, semiconductor light emitting chips are placed in the holes respectively and the semiconductor light emitting device further comprises a metallic bonding part located on the lower face of the bottom part of the body, while keeping a distance from the electrodes of the semiconductor light emitting chip that is exposed towards the lower face of the bottom part of the body.

11. The semiconductor light emitting device of claim 10, wherein the semiconductor light emitting chips placed in their respective holes emit lights having different colors.

12. The semiconductor light emitting device of claim 1, wherein the encapsulating member serves to fix the semiconductor light emitting chip placed in each hole to the body.

13. The semiconductor light emitting device of claim 1, wherein the side wall has a height greater than length of the bottom part.

14. The semiconductor light emitting device of claim 1, wherein plural holes are formed, and barriers are arranged between the holes.

15. The semiconductor light emitting device of claim 1, wherein the hole has slanted lateral faces.

16. The semiconductor light emitting device of claim 1, wherein the body has a protruded portion; and the semiconductor light emitting device further comprises a lens formed on the encapsulating member and between the protruded parts.

* * * * *